United States Patent
Ha et al.

(10) Patent No.: US 7,323,734 B2
(45) Date of Patent: Jan. 29, 2008

(54) PHASE CHANGEABLE MEMORY CELLS

(75) Inventors: Yongho Ha, Kyeonggi-Do (KR); Jihye Yi, Kyeonggi-Do (KR); Hyunjo Kim, Kyeonggi-Do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 445 days.

(21) Appl. No.: 10/374,959

(22) Filed: Feb. 25, 2003

(65) Prior Publication Data
US 2004/0166604 A1    Aug. 26, 2004

(51) Int. Cl.
H01L 27/108 (2006.01)

(52) U.S. Cl. .............. 257/296; 257/3; 257/E31.027; 257/E31.029; 257/379

(58) Field of Classification Search ............. 438/102, 438/238; 257/3, 379, E31.027, E31.029
See application file for complete search history.

(56) References Cited

U.S. PATENT DOCUMENTS

| | | | |
|---|---|---|---|
| 5,789,758 A * | 8/1998 | Reinberg ................. 257/3 |
| 5,814,527 A | 9/1998 | Wolstenholme et al. |
| 5,879,955 A | 3/1999 | Gonzalez et al. |
| 6,015,977 A | 1/2000 | Zahorik |
| 6,031,287 A | 2/2000 | Harshfield |
| 6,087,689 A | 7/2000 | Reinberg |
| 6,147,395 A | 11/2000 | Gilgen |
| 6,150,253 A | 11/2000 | Doan et al. |
| 6,329,666 B1 | 12/2001 | Doan et al. |
| 6,339,544 B1 * | 1/2002 | Chiang et al. ............ 365/163 |
| 6,391,688 B1 | 5/2002 | Gonzalez et al. |
| 6,404,665 B1 * | 6/2002 | Lowrey et al. ........... 365/100 |
| 6,531,373 B2 * | 3/2003 | Gill et al. ................ 438/400 |
| 6,534,780 B1 * | 3/2003 | Gonzalez et al. .......... 257/3 |
| 6,806,528 B2 * | 10/2004 | Lee et al. ............... 257/296 |
| 6,815,266 B2 * | 11/2004 | Rodgers et al. .......... 438/133 |
| 6,830,952 B2 * | 12/2004 | Lung ....................... 438/95 |
| 6,864,503 B2 * | 3/2005 | Lung ....................... 257/30 |
| 6,867,425 B2 * | 3/2005 | Wicker .................... 257/3 |
| 6,909,107 B2 | 6/2005 | Rodgers et al. |
| 2003/0136983 A1 * | 7/2003 | Dennison ................ 257/246 |
| 2004/0113135 A1 * | 6/2004 | Wicker .................... 257/2 |
| 2004/0113192 A1 | 6/2004 | Wicker |
| 2004/0113232 A1 * | 6/2004 | Johnson et al. .......... 257/529 |
| 2004/0124503 A1 * | 7/2004 | Harshfield ............... 257/622 |
| 2004/0166604 A1 * | 8/2004 | Ha et al. ................. 438/102 |
| 2004/0202033 A1 * | 10/2004 | Lowrey ................... 365/200 |
| 2005/0002227 A1 * | 1/2005 | Hideki et al. ............ 365/163 |
| 2005/0030832 A1 * | 2/2005 | Lee et al. ................ 365/232 |
| 2005/0245030 A1 * | 11/2005 | Ha et al. ................. 438/257 |

* cited by examiner

*Primary Examiner*—Thao P. Le
(74) *Attorney, Agent, or Firm*—Marger Johnson & McCollom, P.C.

(57) ABSTRACT

A phase changeable memory cell is disclosed. According to embodiments of the invention, a phase changeable memory cell is formed that has a reduced contact area with one of the electrodes, compared to previously known phase changeable memory cells. This contact area can be a sidewall of one of the electrodes, or a perimeter edge of a contact opening through the electrode. Thus, when the thickness of the electrode is relatively thin, the contact area between the electrode and the phase changeable material pattern is relatively very small. As a result, it is possible to reduce power consumption of the phase changeable memory device and to form reliable and compact phase changeable memory cells.

29 Claims, 13 Drawing Sheets

PHASE CHANGEABLE MEMORY CELLS

TECHNICAL FIELD

This disclosure relates to phase changeable memory devices and, more particularly, to phase changeable memory cells having sidewall contacts adjacent to a phase changeable material, and methods of fabricating the same.

BACKGROUND

Semiconductor memory devices for storing data can be typically categorized as either volatile memory devices or nonvolatile memory devices. Volatile memory devices lose their stored data when they are no longer coupled to their power supplies, whereas nonvolatile memory devices retain their stored data even without supplied power. Thus, nonvolatile memory devices are widely used in applications where the possibility of power supply interruption is present. For example, nonvolatile memory cells are widely used in cellular phones, digital cameras, MP3 players, etc.

One popular type of nonvolatile memory device is made of flash memory cells having stacked gate structures. Each of the stacked gate structures includes a tunnel oxide layer, a floating gate, an inter-gate dielectric layer and a control gate electrode, which are sequentially stacked.

Although flash memory cells have been widely used for a number of years, a relatively new type nonvolatile memory cell is being developed that has several advantages over flash cells. Specifically, a nonvolatile memory device including a phase changeable memory cell is being developed, in part, to replace flash type memory cells.

FIG. 1 is an equivalent circuit diagram of a typical phase changeable memory cell. In FIG. 1, a phase changeable memory cell 10 includes a single access transistor $T_A$ and a single variable resistor $R_v$. The variable resistor $R_v$ includes a bottom electrode, a top electrode and a phase changeable material layer pattern interposed therebetween. The top electrode is electrically connected to a bit line BL. Also, the access transistor $T_A$ includes a source region S that is electrically connected to the bottom electrode, a drain region D which is spaced apart from the source region, and a gate electrode G that is disposed over a channel region between the source region S and the drain region D. The gate electrode G and the drain region D are electrically connected to a word line WL and an interconnection line IL, respectively. As a result, the equivalent circuit of the phase changeable memory cell is similar to that of a DRAM cell. However, properties of the phase changeable material are quite different from that of the dielectric layer of the DRAM cell capacitor. Specifically, the phase changeable material has two stable states that change from one to another based on temperature and time. This allows the variable resistor $R_V$ to have a relatively low or relatively high resistance value, dependent on the state of the phase changeable material. Because this resistance value affects the operation of the memory cell, the state of the phase changeable can be determined by sensing the affect of electrical signals applied to the cell.

FIG. 2 is a graph that illustrates a method of writing data into a phase changeable memory cell. The x-axis represents time T, and the y-axis represents temperature TMP that is applied to the phase changeable material.

Referring to FIG. 2, when the phase changeable material layer is heated to a temperature that is higher than its melting temperature Tm and is cooled down rapidly within a quenching time t1, which is shorter than the crystallization time of the phase changeable material, the phase changeable material layer is transformed into an amorphous state (refer to curve ①). On the contrary, when the phase changeable material layer is heated to a temperature that is in a range between the crystallization temperature Tc and the melting temperature Tm for a second duration T2 (longer than the first duration T1) and is cooled down, the phase changeable material layer is transformed into a crystalline state (refer to curve ②).

Here, a resistivity of the phase changeable material layer in the amorphous state is higher than that of the phase changeable material layer in the crystalline state. Thus, it is possible to determine whether the information stored in the memory cell is a logic "1" or a logic "0" by detecting current that flows through the phase changeable material layer in a read operation of the memory cell.

A material that is widely used as a phase changeable material layer is a compound containing germanium Ge, antimony (stibium) Sb and tellurium Te (hereinafter, referred to as a GST layer).

FIG. 3 is a cross-sectional view of a conventional phase changeable memory cell. In that figure, an isolation layer 13 is located at a predetermined region of a semiconductor substrate 11. The isolation layer 13 defines an active region. A source region 17s and a drain region 17d are disposed in the active region and are spaced apart from each other. A word line is coupled to a gate electrode 15, which is disposed across the active region between the source region 17s and the drain region 17d. The gate electrode 15, the source region 17s and the drain region 17d form an access transistor ($T_A$ of FIG. 1). The substrate 11 having the access transistor is covered with a first insulating layer 19. An interconnection line 21 is disposed on the first insulating layer 19. The interconnection line 21 is electrically connected to the drain region 17d through a contact hole that penetrates the first insulating layer 19. A second insulating layer 23 covers the interconnection line 21. A heating plug 25 is disposed in the first and second insulating layers 19 and 23. The heating plug 25 is electrically connected to the source region 17s. A phase changeable material layer pattern 27 and a top electrode 29 are sequentially stacked on the second insulating layer 23. A bottom surface of the phase changeable material layer pattern 27 is in contact with the heating plug 25. A third insulating layer 31 is disposed on the second insulating layer 23, and sidewalls of the phase changeable material layer pattern 27 and the top electrode 29 are surrounded by the third insulating layer 31. A bit line 33 is located on the third insulating layer 31 and is in contact with the top electrode 29.

In a write mode, the access transistor TA is turned on and a large current flows through the heating plug 25. As a result, an interface between the phase changeable material layer pattern 27 and the heating plug 25 is heated up to transform a portion 27a of the phase changeable material layer 27 into either the amorphous state or the crystalline state, dependant on the length of time and amount of current that flows through the heating plug 25, as explained with reference to FIG. 2.

One problem with the conventional phase changeable transistor as shown in FIG. 3 is that it requires a relatively large amount of current to successfully change the state of the phase changeable material in a successful write operation. One solution would be to reduce a diameter D of the heating plug 25. However, there is a limitation in reducing the diameter D of the heating plug 25, because the minimum diameter D is determined by a photolithographic process. That is to say, it is difficult to consistently make the heating plug 25 with a small diameter because of limitations in the present semiconductor processes.

Embodiments of the invention address this and other limitations of the prior art.

DETAILED DESCRIPTION

Embodiments of the present invention include phase changeable memory cells having a phase changeable material formed between a first electrode and adjacent to a sidewall contact of a second electrode. Because the structure of the inventive memory cells does not include features that depend on minimum design constraints of semiconductor processing, elements of the cells can be made much smaller than elements in conventional memory cells. Therefore, memory cells according to embodiments of the invention can be designed to use much less power than conventional phase changeable memory cells.

Figure 4:
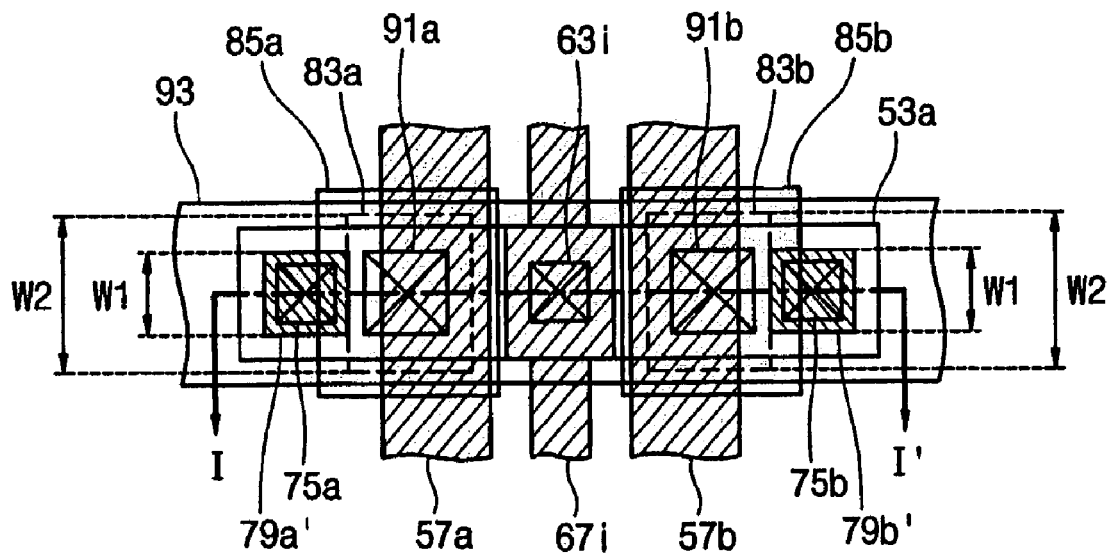
FIG. 4 is a diagram of a layout view of a pair of phase changeable memory cells according to embodiments of the invention.
Figure 5:
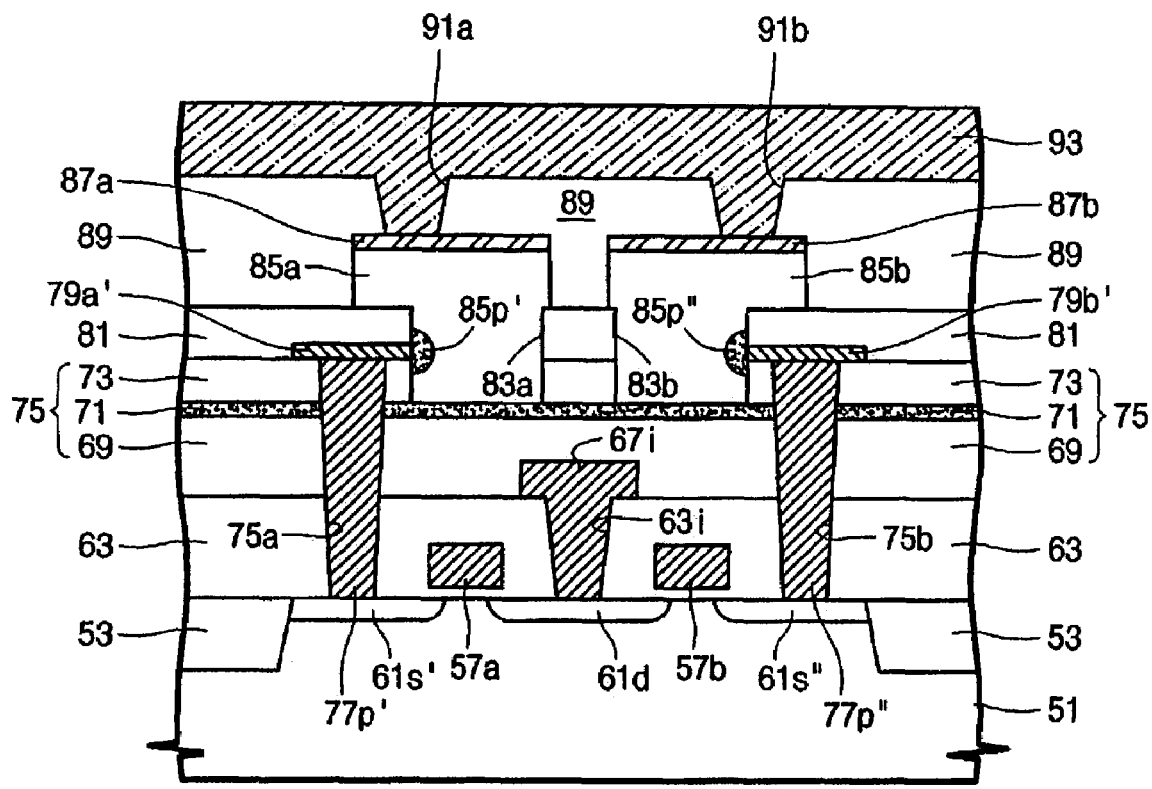
FIG. 5 is a cross-sectional view of a portion of the pair of phase changeable memory cells of FIG. 4.

FIG. 4 is a top plan view illustrating a pair of phase changeable memory cells according to an embodiment of the present invention, and FIG. 5 is a cross-sectional view taken along a line I-I' of FIG. 4.

Referring to FIGS. 4 and 5, an isolation layer 53 is disposed at a predetermined region of a semiconductor substrate 51. The isolation layer 53 defines edges of an active region 53a. A first source region 61s' and a second source region 61s" are located at both ends of the active region 53a, respectively. In addition, a common drain region 61d is centrally disposed in the active region 53a. A first gate electrode 57a spans a first channel region between the first source region 61s' and the common drain region 61d. Similarly, a second gate electrode 57b spans a second channel region between the second source region 61s" and the common drain region 61d. The first and second gate electrodes 57a and 57b act as a first word line and a second word line, respectively. The first gate electrode 57a, the first source region 61s' and the common drain region 61d constitute a first access transistor. Also, the second gate electrode 57b, the second source region 61s" and the common drain region 61d constitute a second access transistor.

The substrate 51 is covered with a first insulating layer 63. An interconnection line 67i is disposed on the first insulating layer 63 and is electrically connected to the common drain region 61d through a drain contact hole 63i that penetrates a portion of the first insulating layer 63. The interconnection line 67i runs in parallel with the word lines 57a and 57b. However, the interconnection line 67i may overlap the word lines 57a and 57b. The substrate having the interconnection line 67i is covered with a second insulating layer 75. In some embodiments, the second insulating layer 75 includes a lower insulating layer 69, an etch stop layer 71 and an upper insulating layer 73. In this case, the lower insulating layer 69 and the upper insulating layer 73 may be a silicon oxide layer, for instance, and the etch stop layer may be a silicon nitride layer having an etch selectivity with respect to the silicon oxide layer, for instance.

The first source region 61s' is exposed by a first electrode contact hole 75a that passes through the first and second insulating layers 63 and 75. Similarly, the second source region 61s" is exposed by a second electrode contact hole 75b that passes through the first and second insulating layers 63 and 75. The first electrode contact hole 75a is filled with a first electrode contact plug 77p', and the second electrode contact hole 75b is filled with a second electrode contact plug 77p". Although not shown in FIG. 5, the contact plugs 77p' and 77p" may be formed in two stages, i.e., a first portion extending through only the insulating layer 63, and a second portion extending through only the insulating layer 75.

A first bottom electrode 79a' and a second bottom electrode 79b' are disposed on the second insulating layer 75. The first bottom electrode 79a' covers the first electrode contact plug 77p', and the second bottom electrode 79b' covers the second electrode contact plug 77p". The substrate having the first and second bottom electrodes 79a' and 79b' is covered with a third insulating layer 81.

A portion of the etch stop layer 71 is exposed by a first trench 83a, and another portion of the etch stop layer 71 is exposed by a second trench 83b. Also, the first and second trenches 83a and 83b expose a portion of the sidewall of the first bottom electrode 79a' and a portion of the sidewall of the second bottom electrode 79b', respectively. Even when the second insulating layer 75 is a single oxide layer, it is preferable that the interconnection line 67i be still covered with a portion of the second insulating layer 75.

Figure 3:
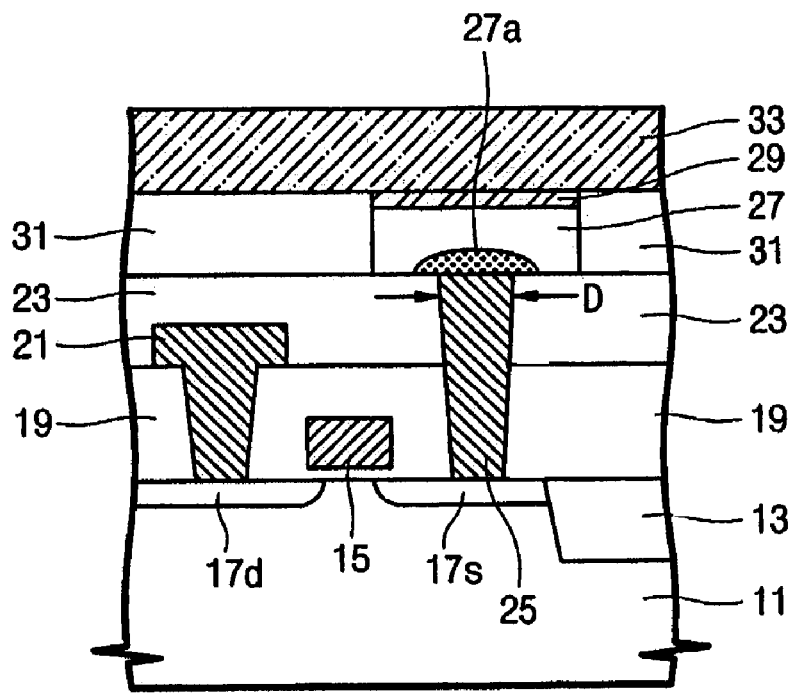
FIG. 3 is a cross-sectional view of a portion of a phase changeable memory cell according to the prior art.

It is relatively easy to control the thickness of the bottom electrodes 79a' and 79b'. For example, the thickness of the bottom electrodes 79a' and 79b' can be less than 50 nanometers (e.g., between about 3 to 7 nanometers). Accordingly, in the event that the thickness of the bottom electrodes 79a' and 79b' is very thin, the areas of the exposed sidewalls of the bottom electrodes 79a' and 79b' are remarkably decreased as compared to the contact area between the bottom electrode and the phase changeable material of the conventional art (FIG. 3). For example, the contact area between the bottom electrodes 79a' and 79b' and the phase changeable material can be less than 5000 square nanometers (e.g., less than 500 square nanometers). In addition, it is preferable that a width of the first and second bottom electrodes 79a' and 79b' (a first width W1) (FIG. 4) is less than a width of the first and second trenches 83a and 83b (a second width W2). For example the first width W1 can be between about 20 to 150 nanometers. This allows for uniform areas of the exposed sidewalls of the bottom electrodes 79a' and 79b', even if a misalignment between the bottom electrodes and the trenches 83a and 83b occurs along a direction that is parallel to the word lines 57a and 57b.

The first and second trenches 83a and 83b are filled with a first phase changeable material layer pattern 85a and a second phase changeable material layer pattern 85b, respectively. As described above, a common phase changeable material is a compound containing germanium Ge, antimony (stibium) Sb and tellurium Te (a GST layer), although any material having the appropriate qualities is useable by embodiments of the invention.

When the trenches 83a and 83b are filled with the GST layer, the GST layer is adjacent to sidewall contact areas of the bottom electrodes 79a' and 79b'. The contact area between the GST layer and these sidewall contacts is remarkably reduced as compared to the contact area of the conventional art. This translates into a much lower amount of current compared to prior art circuits (FIG. 3) necessary to set or reset the GST layer to store data within the memory cell.

Top surfaces of the first and second phase changeable material layer patterns 85a and 85b are covered with a first top electrode 87a and a second top electrode 87b, respectively. A fourth insulating layer 89 covers the top electrodes 87a and 87b, as well as other areas of the substrate 11. The first top electrode 87a is exposed by a first bit line contact hole 91a that passes through a portion of the fourth insulating layer 89. Similarly, the second top electrode 87b is exposed by a second bit line contact hole 91b that passes through another portion of the fourth insulating layer 89. A bit line 93 is located on the fourth insulating layer 89. The bit line 93 is disposed to cross over the word lines 57a and 57b. Also, the bit line 93 is electrically connected to the top electrodes 87a and 87b through the bit line contact holes 91a and 91b.

As described above, the respective phase changeable memory cells according to embodiments of the invention include the sidewall contact between the bottom electrode and the phase changeable material layer pattern. As mentioned above, the sidewall contact area of the bottom electrodes is not subject to the minimum design rule, which is determined by the resolution limit of the photolithography process. Rather, the sidewall contact area can be formed to be much smaller than the contact area between the bottom electrode and the phase changeable material layer pattern in the conventional art. Accordingly, it is possible to increase the current density at the sidewall contact of the bottom electrodes without employing a large access transistor. Thus, phase transition regions 85p' and 85p'' can be successfully formed in the first and second phase changeable material layer patterns 85a and 85b with small access transistors. Consequently, power consumption of memory cells according to embodiments of the invention is typically markedly reduced compared to cells of the prior art.

Figure 6:
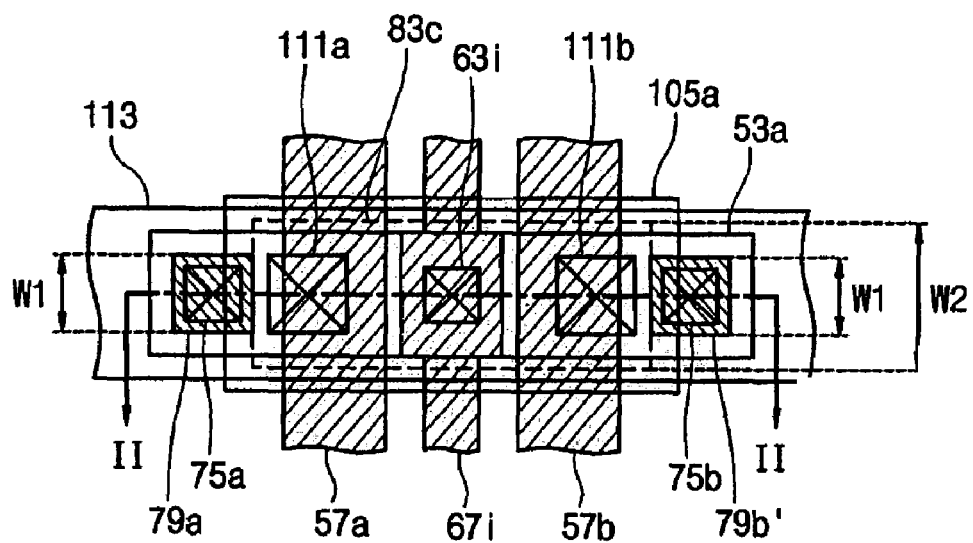
FIG. 6 is a diagram of a layout view of a pair of phase changeable memory cells according to embodiments of the invention.
Figure 7:
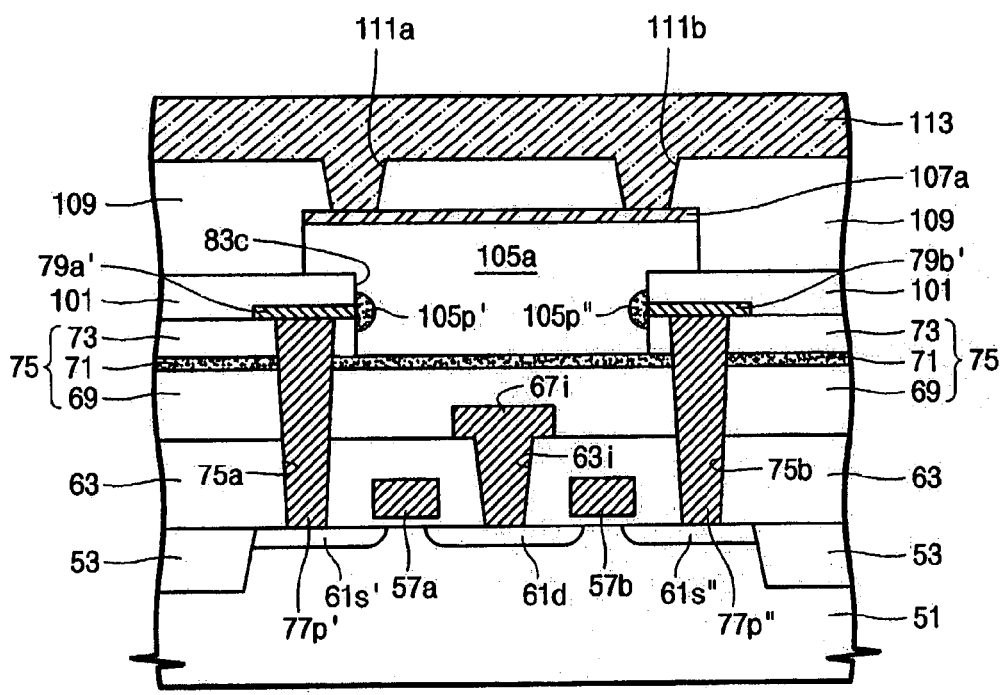
FIG. 7 is a cross-sectional view of a portion of the pair of phase changeable memory cells of FIG. 6.

FIG. 6 is a top plan view for illustrating a pair of phase changeable memory cells according to another embodiment of the present invention, and FIG. 7 is a cross-sectional view taken along a line II-II' of FIG. 6. This embodiment differs from the embodiment illustrated in FIGS. 4 and 5 in that a pair of memory cells are formed in a single active region and share a single common phase changeable material layer pattern. However, the active region, access transistors, interconnection line, insulating layers, bottom electrodes and the bit line of this embodiment have the same configurations as in the previously described embodiment. Thus, the explanations for those areas are omitted or mentioned only briefly.

Referring to FIGS. 6 and 7, the bottom electrodes 79a' and 79b' are covered with a third insulating layer 101. The etch stop layer 71 between the first and second bottom electrodes 79a' and 79b' is exposed by a single common trench 83c. Also, the common trench 83c exposes a portion of the sidewall of the first bottom electrode 79a' and a portion of the sidewall of the second bottom electrode 79b'. It is preferable that a width of the common trench 83c (a second width W2) (FIG. 6) is greater than a width of the bottom electrodes 79a' and 79b' (a first width W1). The common trench 83c is filled with a common phase changeable material layer pattern 105a. A first portion 105p' of the common phase changeable material layer pattern 105a, which is in contact with the exposed sidewall of the first bottom electrode 79a', can be transformed into an amorphous state or a crystalline state according to current density at the interface between the first bottom electrode 79a' and the common phase changeable material layer pattern 105a. Similarly, a second portion 105p'' of the common phase changeable material layer pattern 105a, which is in contact with the exposed sidewall of the second bottom electrode 79b', can be transformed into an amorphous state or a crystalline state according to current density at the interface between the second bottom electrode 79b' and the common phase changeable material layer pattern 105a. A top surface of the common phase changeable material layer pattern 105a is covered with a top electrode 107a.

The top electrode 107a and other portions of the substrate 51 are covered with a fourth insulating layer 109. The top electrode 107a is exposed by a first bit line contact hole 111a and a second bit line contact hole 111b that pass through the fourth insulating layer 109. Alternatively, the top electrode 107a may be exposed by a single bit line contact hole (not shown) instead of the first and second bit line contact holes 11a and 111b. A bit line 113 is located on the fourth insulating layer 109 as in the embodiment described with reference to FIGS. 4 and 5. The bit line 113 is formed such that it can cross over the word lines 57a and 57b. Also, the bit line 113 electrically connects to the top electrode 107a through the bit line contact holes 111a and 111b.

In this embodiment, a pair of memory cells shares the single common phase changeable material layer pattern 105a. Thus, it is possible to form a compact memory cell.

Figure 8:
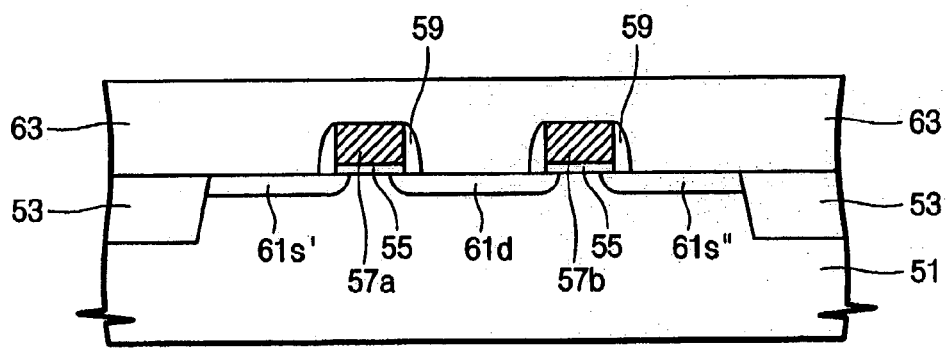
FIGS. 8-13 are cross-sectional diagrams illustrating processes used to form memory cells according to embodiments of the invention as illustrated in FIGS. 4 and 5.

FIGS. 8-13 illustrate methods of fabricating the phase changeable memory cells described with reference to the earlier FIGS. 4 and 5. Referring to FIGS. 4, 5 and 8, an isolation layer 53 is formed at a predetermined region of a semiconductor substrate 51. The isolation layer 53 defines edges of an active region (53a of FIG. 4). The isolation layer 53 may be formed by a conventional manner such as a trench isolation technique. A gate insulating layer 55 is formed on the active region 53a. The gate insulating layer 55 may be formed of a thermal oxide layer, for instance. A gate conductive layer is then formed on an entire surface of the substrate having the gate insulating layer 55. The gate conductive layer is patterned to form a pair of gate electrodes 57a and 57b that cross over the active region 53a. The gate electrodes 57a and 57b act as word lines in the completed memory cell.

After the gate electrodes 57a and 57b are formed, impurity ions are implanted into the active region using the gate electrodes as ion implantation masks. As a result, a common drain region 61d is formed in the active region between the first and second gate electrodes 57a and 57b. In addition, a first source region 61s' is formed at the active region that is adjacent to the first gate electrode 57a and opposite the common drain region 61d, and a second source region 61s" is formed in the active region that is adjacent to the second gate electrode 57b and opposite the common drain region 61d. Therefore, a pair of access transistors is formed in the active region. The first access transistor includes the first gate electrode 57a, the first source region 61s' and the common drain region 61d, and the second access transistor includes the second gate electrode 57b, the second source region 61s" and the common drain region 61d.

Further, a gate spacer 59 may be formed on sidewalls of the gate electrodes 57a and 57b. In this case, the source/drain regions 61s', 61s" and 61d may have an LDD-type structure. As illustrated in FIG. 8, a first insulating layer 63 is then formed on the entire surface of the substrate 51.

Figure 9:
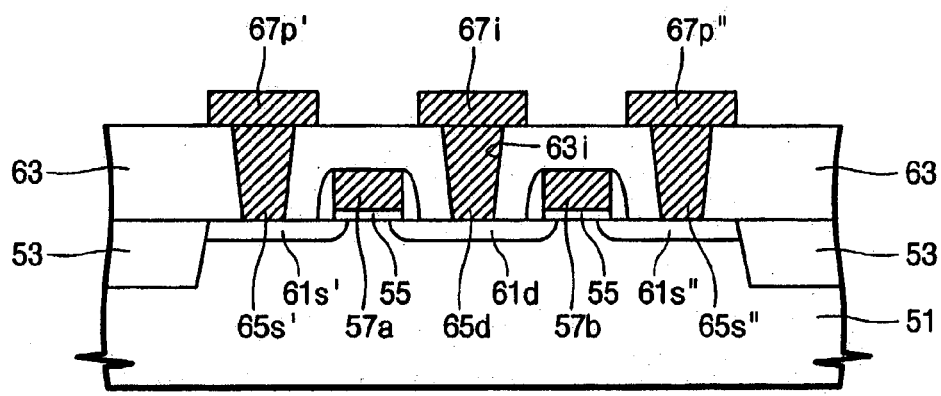

Referring to FIGS. 4, 5 and 9, the first insulating layer 63 is patterned to form a drain contact hole 63i, and first and second source contact holes (unnumbered but illustrated). The drain contact hole 63i exposes the common drain region 61d. Also, the first and second source contact holes expose the first and second source regions 61s' and 61s", respectively. A first source contact plug 65s', a second source contact plug 65s" and a drain contact plug 65d are formed in the respective contact holes in a conventional manner.

A conductive layer is formed on the substrate 51 after the contact plugs 65d, 65s' and 65s" have been formed. The conductive layer is then patterned to form a first pad 67p', a second pad 67p" and an interconnection line 67i. The first and second pads 67p' and 67p" are formed to cover the first and second source contact plugs 65s' and 65s", respectively. Also, the interconnection line 67i is formed to cover the drain contact plug 65d. As illustrated in FIG. 9, the interconnection line 67i is formed to be parallel to the word lines 57a and 57b. However, the interconnection line 67i may be formed to cross over the word lines 57a and 57b.

It is not strictly necessary that the first and second source contact holes, the first and second source contact plugs 65s' and 65s", and the first and second pads 67p' and 67p" even be formed. For instance, the memory cells illustrated in FIGS. 5 and 7 do not include these structures. Having these multiple-stage contact structures, however, relieves the necessity of making contact holes through both the insulating layers 75 and 63 at the same time in a later step, which may be difficult to accurately control. Additionally, because the same or similar process steps are used in forming those structures as forming the drain contact plug 65d and the interconnect line 67i, it is not a large extra expense to create these intermediate first and second pads 69p' and 67p".

Figure 10:
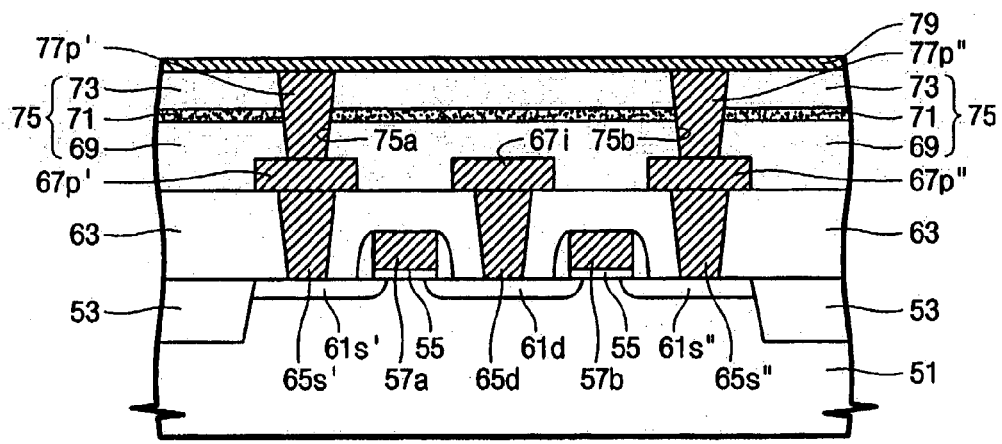

Referring to FIGS. 4, 5 and 10, a second insulating layer 75 is formed on the substrate 51 over the interconnection line 67i, and over the pads 67p' and 67p" if present. The second insulating layer 75 is preferably formed by sequentially stacking a lower oxide layer 69, an etch stop layer 71 and an upper oxide layer 73. In this case, the etch stop layer 71 may be formed of a nitride layer that has an etch selectivity with respect to the upper oxide layer 73. Alternatively, the second insulating layer 75 can be formed of a single oxide layer. The second insulating layer 75 is patterned to form a first electrode contact hole 75a and a second electrode contact hole 75b. The first and second electrode contact holes 75a and 75b expose the first and second pads 67p' and 67p", respectively. If the first and second pads 67p' and 67p" and the first and second source contact plugs 65s' and 65s" are not formed in the previous processes, the first and second electrode contact holes 75a and 75b are formed by successively patterning both the second insulating layer 75 and the first insulating layer 63. In this case, the first and second electrode contact holes 75a and 75b expose the first and second source regions 61s' and 61s", respectively.

Subsequently, a first electrode contact plug 77p' and a second electrode contact plug 77p" are formed in the first and second electrode contact holes 75a and 75b, respectively. The first and second electrode contact plugs 77p' and 77p" may be formed using conventional processes.

Next, a bottom electrode layer 79 is formed on the surface of the substrate 51, over the electrode contact plugs 77p' and 77p". The bottom electrode layer 79 may be formed of, for example, a TiN layer, a TiAlN layer, a TaN layer, a carbon layer or a TiW layer using a PVD process or a CVD process. The bottom electrode layer 79 is preferably formed to have a thickness of between about 1 nano-meter and 50 nano-meters. It is relatively easy to control the thickness of the bottom electrode layer 79 by using processes known in the art. In addition, compared to the contact holes of the prior art (FIG. 3), it is recognizable to those skilled in the art that the thickness uniformity of the bottom electrode layer 79 (which becomes the sidewall contacts of the memory cells) throughout the substrate is superior to the critical dimension (feature size) variation of the contact holes defined by the photolithography process.

In some embodiments, a further insulating layer (not shown) is formed on the bottom electrode layer 79 before performing the next process.

Figure 11:
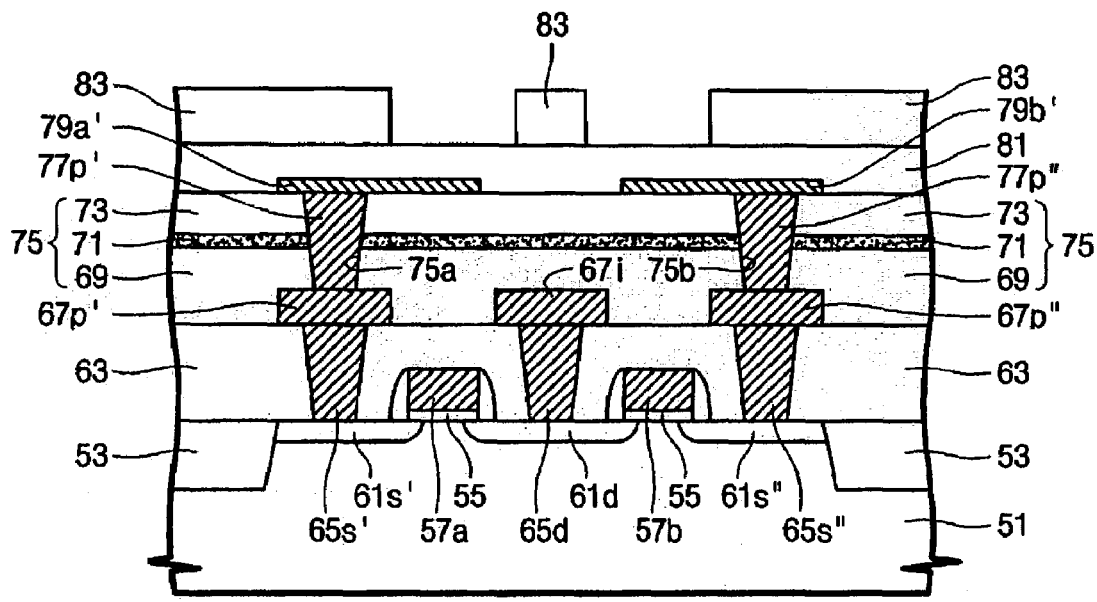

Referring to FIGS. 4, 5 and 11, the bottom electrode layer 79 (and the insulating layer formed thereon, if present) is patterned to form a first preliminary bottom electrode 79a and a second preliminary bottom electrode 79b that are spaced apart from each other. The first preliminary bottom electrode 79a covers the first electrode contact plug 77p', and the second preliminary bottom electrode 79b covers the second electrode contact plug 77p". The first and second preliminary bottom electrodes 79a and 79b are formed to have a first width (W1 of FIG. 4). Next, a third insulating layer 81 is formed on the substrate having the preliminary bottom electrodes 79a and 79b. A photoresist pattern 83 is then formed on the third insulating layer 81.

Figure 12:
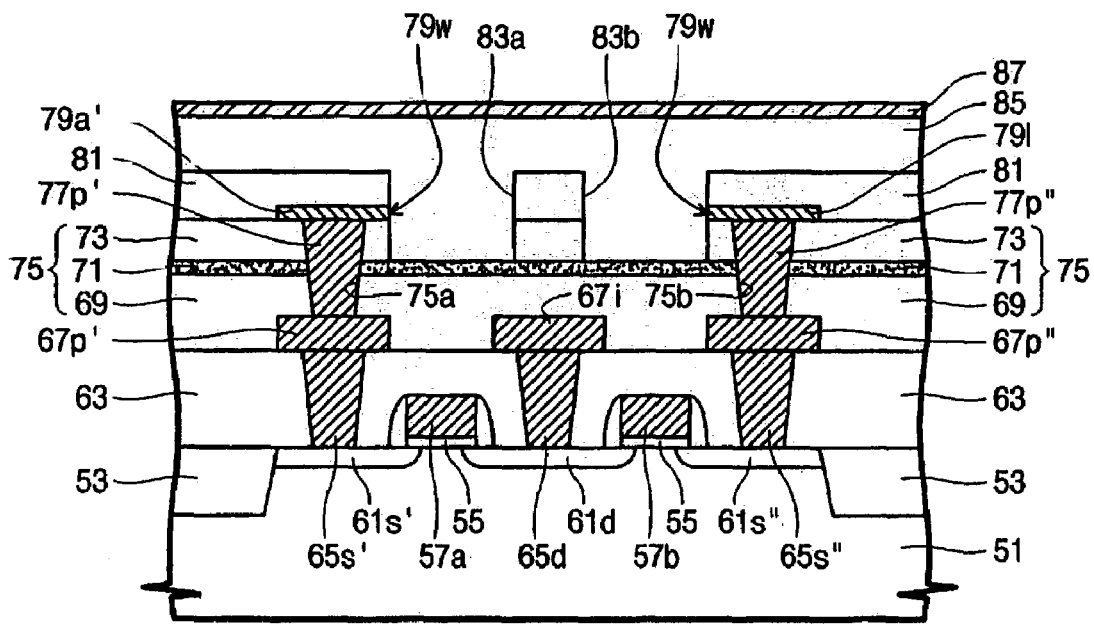

Referring to FIGS. 4, 5 and 12, the third insulating layer 81, the preliminary bottom electrodes 79a and 79b, and the upper oxide layer 73 are successively etched using the photoresist pattern 83 as an etching mask. As a result, a first trench 83a and a second trench 83b are formed in the third insulating layer 81 and in the upper oxide layer 73 in a location between the first and second electrode contact plugs 77p' and 77p". In addition, the first preliminary bottom electrode 79a is etched to form a first bottom electrode 79a', and the second preliminary bottom electrode 79b is etched to form a second bottom electrode 79b'. Thus, the first trench 83a exposes a portion of sidewall (79W) of the first bottom electrode 79a' as well as a portion of the etch stop layer 71, and the second trench 83b exposes a portion of sidewall (79W) of the second bottom electrode 79b' as well as another portion of the etch stop layer 71. Using this technique, it is possible to reduce significantly the area of the exposed sidewall 79W of the bottom electrodes 79a' and 79b'. That is to say, the area of the exposed sidewall 79W is not subject to the resolution limit of the photolithography process, as is the conventional art, but rather the area of the exposed sidewall 79W is a function of the thickness of the layer 79 used to form the bottom electrodes 79a' and 79b'. This thickness can be precisely controlled.

The first and second trenches 83a and 83b are preferably formed to have a second width (W2 of FIG. 4) that is greater than the first width W1. This allows for uniform areas of the exposed sidewalls of the bottom electrodes 79a' and 79b', even though a misalignment between the bottom electrodes and the photoresist pattern 83 may occur along a direction that is parallel to the word lines 57a and 57b.

In an alternative embodiment, if the second insulating layer 75 is formed of a single oxide layer, then the second insulating layer 75 is preferably only partially etched during the formation of the trenches 83a and 83b. This prevents the interconnection line 67i from being exposed by the trenches 83a and 83b.

Subsequent to forming the trenches 83a and 83b, the photoresist pattern 83 is removed. A phase changeable material layer 85 and a top electrode layer 87 are sequentially formed on the substrate where the photoresist pattern 83 was removed. The phase changeable material layer 85 may be formed of the GST layer, described above, and the top electrode layer 87 can be formed of, for example, a TiN layer, a TiAlN layer, a TaN layer, a carbon layer or a TiW layer using a PVD technique or a CVD technique.

Figure 13:
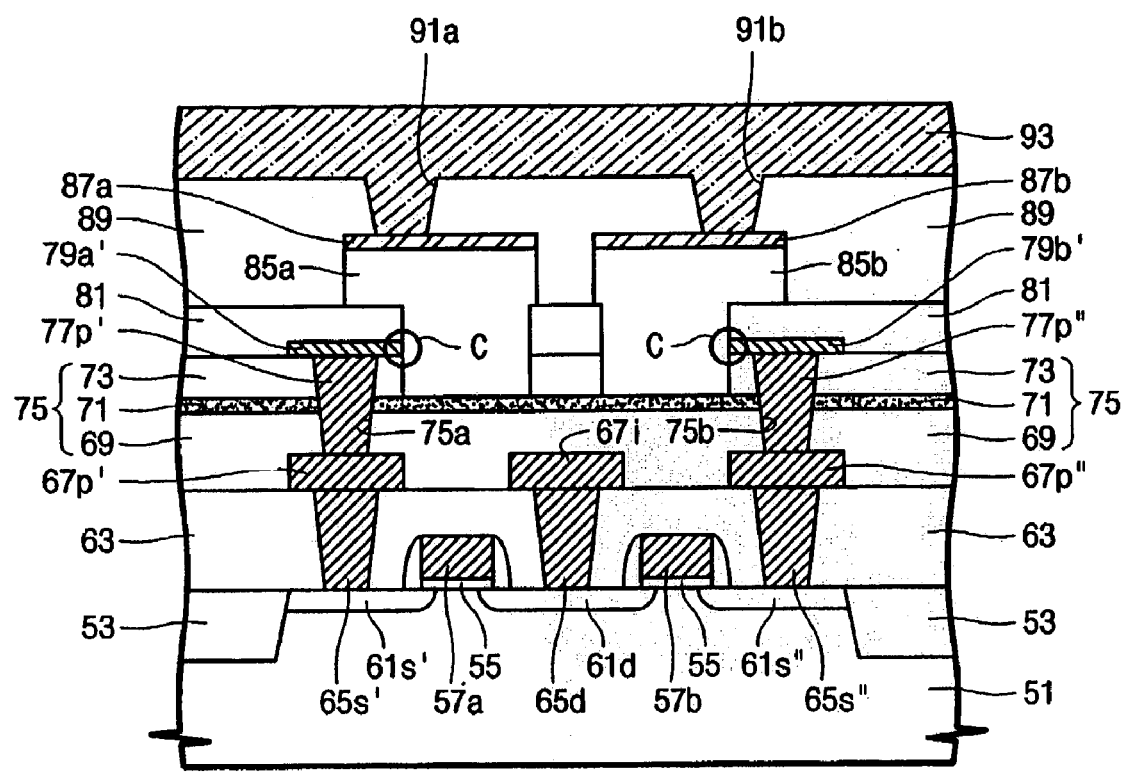

Referring to FIGS. 4, 5 and 13, the top electrode layer 87 and the phase changeable material layer 85 are patterned to form a first data storage pattern and a second data storage pattern. The first data storage pattern includes a first phase changeable material pattern 85a on which is stacked a first top electrode 87a, and the second data storage pattern includes a second phase changeable material pattern 85b on which a second top electrode 87b is stacked. Also, the first phase changeable material pattern 85a generally fills the first trench 83a, and the second phase changeable material pattern 85b generally fills the second trench 83b. Contact regions C between the bottom electrodes 79a' and 79b' and the phase changeable material patterns 85a and 85b, respectively, are illustrated in FIG. 13. They are much smaller than the comparable contact regions of the prior art, illustrated in FIG. 3.

Next, a fourth insulating layer 89 is formed covering the phase changeable material patterns 85a, 85b and the top electrodes 87a, 87b. The fourth insulating layer 89 is patterned to form a first bit line contact hole 91a and a second bit line contact hole 91b. The first and second bit line contact holes 91a and 91b expose the first and second top electrodes 87a and 87b, respectively. A conductive layer is formed on the fourth insulating layer 89 and in the bit line contact holes 91a and 91b. The conductive layer is patterned to form a bit line 93, which crosses over the word lines 57a and 57b. As illustrated in FIG. 13, the bit line 93 is electrically connectable to the first and second top electrodes 87a and 87b through the first and second bit line contact holes 91a and 91b.

Figure 14:
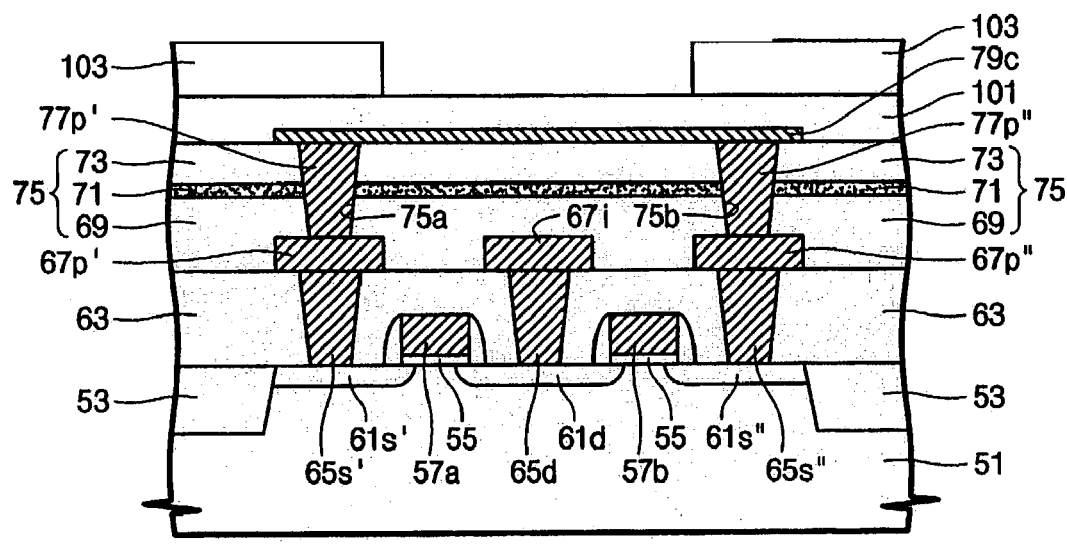
FIGS. 14-16 are cross-sectional diagrams illustrating processes used to form memory cells according to embodiments of the invention as illustrated in FIGS. 6 and 7.
Figure 15:
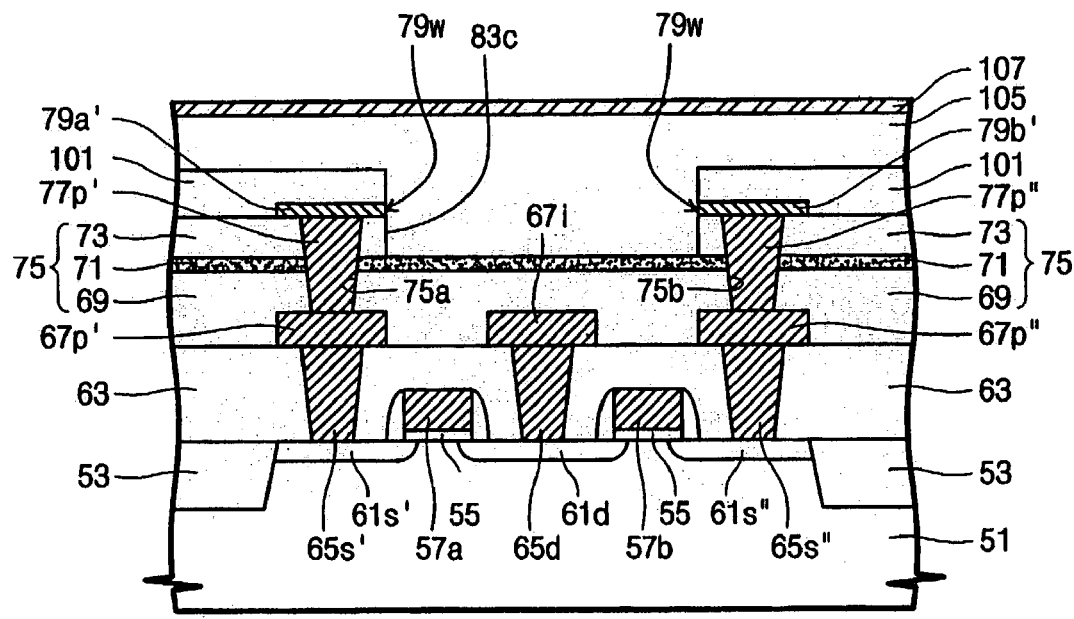
Figure 16:
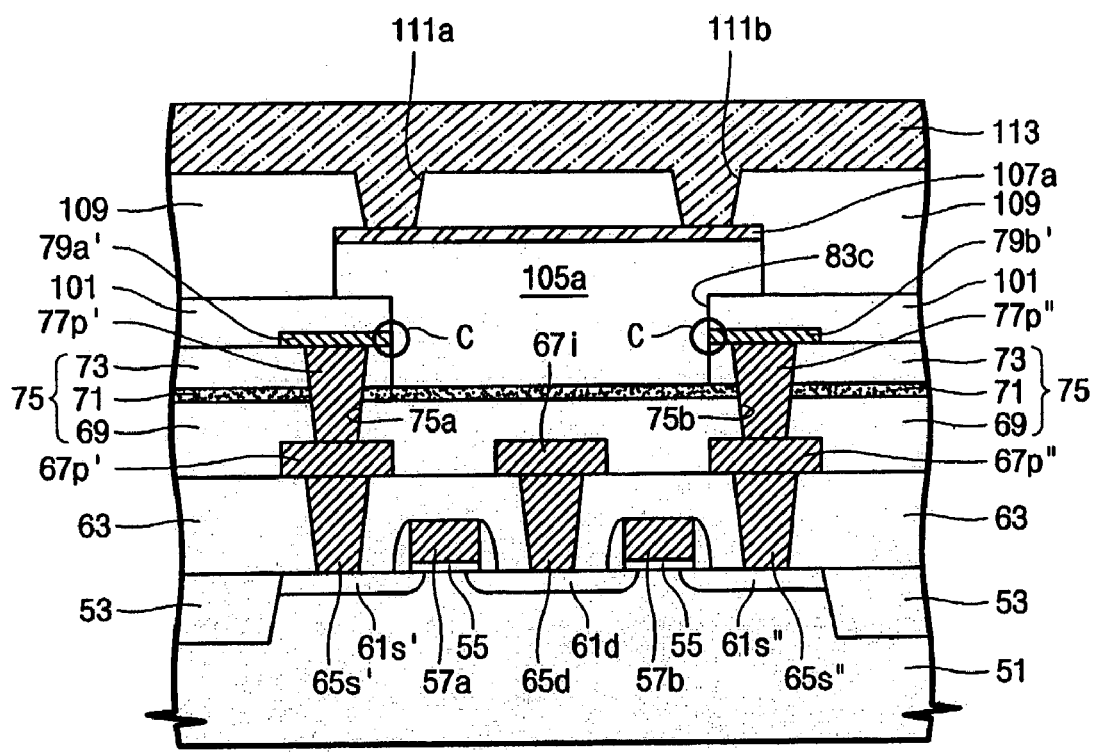

FIGS. 14 to 16 are cross-sectional views for illustrating a method of fabricating the phase changeable memory cells according to embodiments of the invention illustrated in FIGS. 6 and 7.

Referring to FIGS. 6, 7 and 14, a pair of access transistors, an interconnection line 67i and a bottom electrode layer are formed in the same manner as described above with reference to FIGS. 8 to 10. The bottom electrode layer is then patterned to form a preliminary bottom electrode 79c that covers the first and second electrode contact plugs 77p' and 77p'' as well as a second insulating layer 75 between the first and second electrode contact plugs. Alternatively, the bottom electrode layer may be patterned to form the first and second preliminary bottom electrodes 79a and 79b as explained in the embodiments illustrated in FIGS. 4-5. The preliminary bottom electrode 79c is formed to have a first width (W1 of FIG. 6). A third insulating layer 101 is formed over the preliminary bottom electrode 79c and other areas of the substrate 51. A photoresist pattern 103 is then formed on the third insulating layer 101.

Referring to FIGS. 6, 7 and 15, the third insulating layer 101, the preliminary bottom electrode 79c and the upper oxide layer 73 are successively etched using the photoresist pattern 103 as an etching mask. As a result, the preliminary bottom electrode 79c is separated into two bottom electrodes 79a' and 79b', and a common trench 83c is formed on the etch stop layer 71 between the first and second electrode contact plugs 77p' and 77p''. Therefore, the common trench 83c exposes a portion of the sidewall (79W) of the first bottom electrode 79a', a portion of the sidewall (79W) of the second bottom electrode 79b', and a portion of the etch stop layer 71. The first and second bottom electrodes 79a' and 79b' cover the first and second electrode contact plugs 77p' and 77b', respectively. Also, the common trench 83c is preferably formed to have a second width (W2 of FIG. 6), which is greater than the first width (W1 of FIG. 6) in order to obtain uniform areas of the exposed sidewalls 79W of the bottom electrodes 79a' and 79b' regardless of any misalignment between the bottom electrodes and the photoresist pattern 83.

In an alternative embodiment, if the second insulating layer 75 is formed of a single oxide layer, then the second insulating layer 75 is preferably only partially etched during the formation of the common trench 83c. This prevents the interconnection line 67i from being exposed by the common trench 83c.

Subsequently, the photoresist pattern 103 is removed. A phase changeable material layer 105 and a top electrode layer 107 are sequentially formed, as illustrated in FIG. 15. The phase changeable material layer 105 may be formed of the GST layer, and the top electrode layer 107 can be formed of, for example, a TiN layer, a TiAlN layer, a TaN layer, a carbon layer or a TiW layer using a PVD technique or a CVD technique.

Referring to FIGS. 6, 7 and 16, the top electrode layer 107 and the phase changeable material layer 105 are patterned to form a common data storage pattern. The common data storage pattern includes a common phase changeable material pattern 105a and a common top electrode 107a stacked thereon. Also, the common phase changeable material pattern 105a is formed to cover the common trench 83c. As a result, the area of the contact regions C, between the bottom electrodes 77p' and 77p'' and the common phase changeable material pattern, is much smaller than the comparable area in memory cells of the prior art.

A fourth insulating layer 109 is then formed on the top electrode layer 107, as illustrated in FIG. 16. The fourth insulating layer 109 is patterned to form a first bit line contact hole 111a and a second bit line contact hole 111b. The first and second bit line contact holes 111a and 111b are preferably formed to be adjacent to the first and second bottom electrodes 79a' and 79b', respectively. Alternatively, the fourth insulating layer 109 may be patterned to form a single bit line contact hole (not shown) that exposes a center region of the common top electrode 107a. A bit line 113 is then formed on the fourth insulating layer 109 using the same manner as described above with reference to bit line 93.

Figure 17:
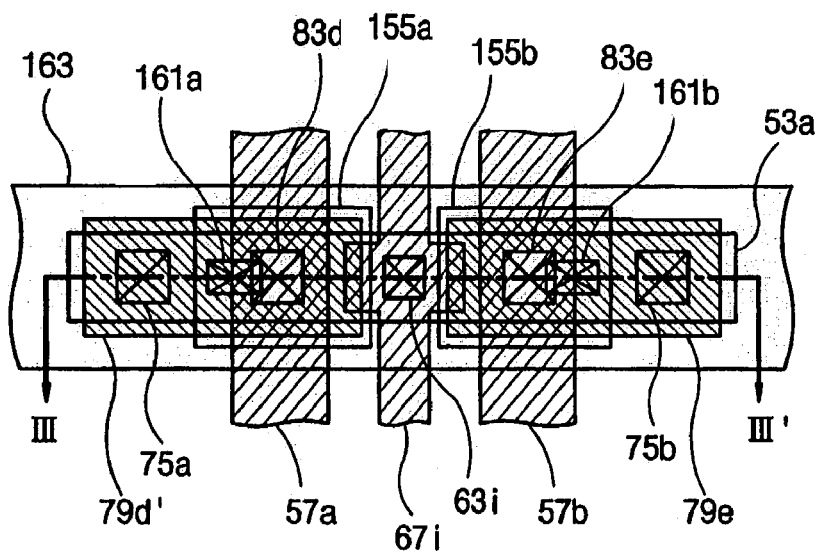
FIG. 17 is a diagram of a layout view of a pair of phase changeable memory cells according to embodiments of the invention.
Figure 18:
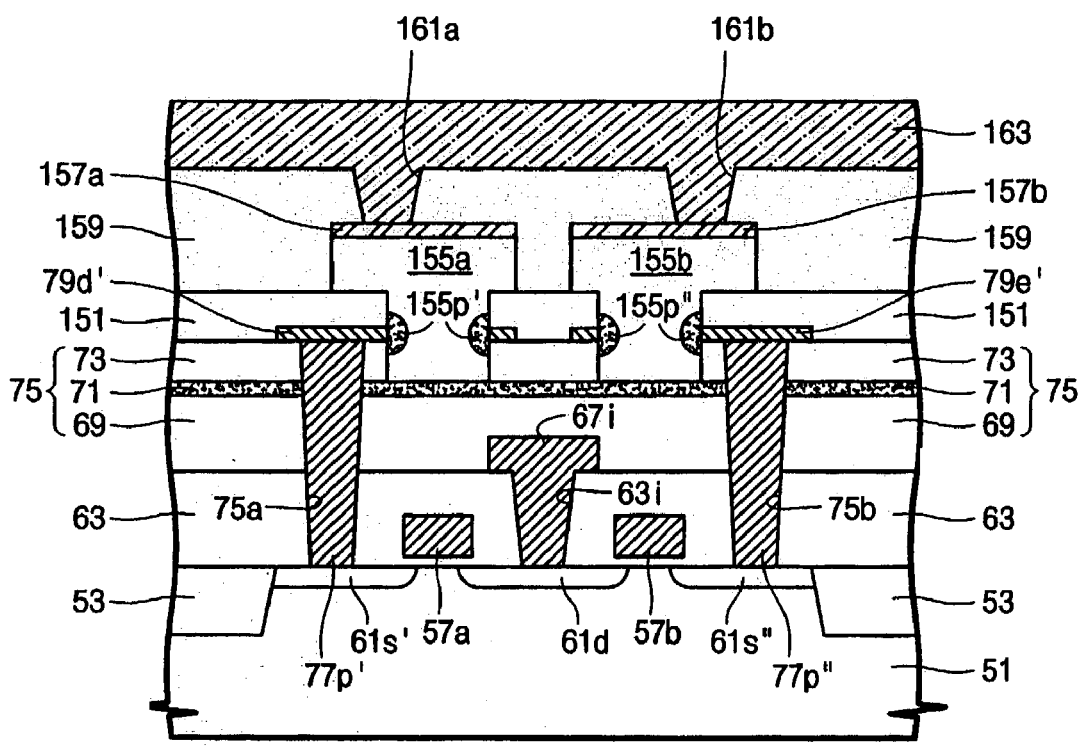
FIG. 18 is a cross-sectional view of a portion of the pair of phase changeable memory cells of FIG. 17.

FIG. 17 is a top plan view illustrating a pair of phase changeable memory cells according to a further embodiment of the present invention, and FIG. 18 is a cross-sectional view taken along a line III-III' of FIG. 17. The memory cells of FIG. 17 differ from those of the earlier figures in that a bottom electrode 79d' and 79e' is formed much larger than the bottom electrodes 79a' and 79b' of FIGS. 4 and 6.

Additionally, the contact openings 83d and 83e extend through the bottom electrodes 79d' and 79e', respectively, whereas the contact openings 83a, 83b, and 83c only extend through one edge of their respective bottom electrodes. Therefore, a portion of the bottom electrodes 79d' and 79e' that contact a phase transition region 155p' and 155p'' (FIG. 18) is larger than the similar portion of the bottom electrodes 79a' and 79b' of FIGS. 4 and 6. This may be counter-intuitive as compared to the other embodiments, in that one benefit of embodiments of the invention is to reduce the amount of area of the bottom electrode in contact with the phase transition region. However, the total amount of contact area will still be small compared to cells of the prior art (FIG. 3), and the amount of area of contact has very little variance from cell to cell due to production variances, which provides other benefits to manufacturing the cells in this way.

Figure 19:
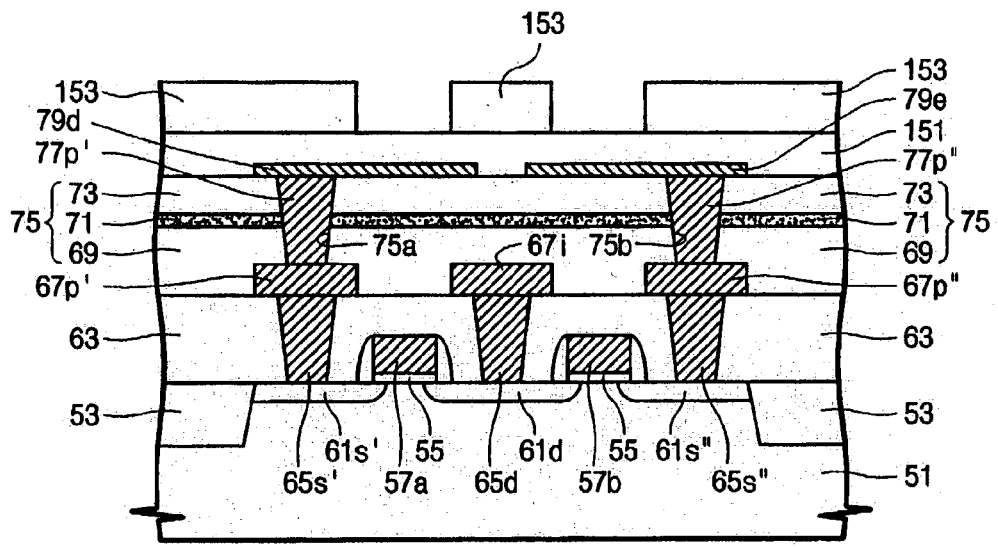
FIGS. 19-21 are cross-sectional diagrams illustrating processes used to form memory cells according to embodiments of the invention as illustrated in FIGS. 17 and 18.
Figure 20:
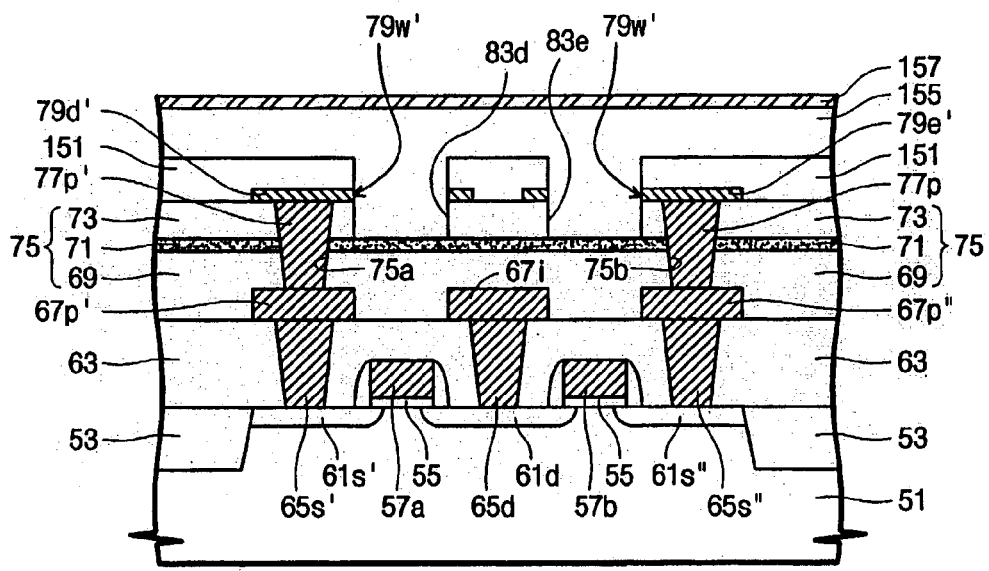
Figure 21:
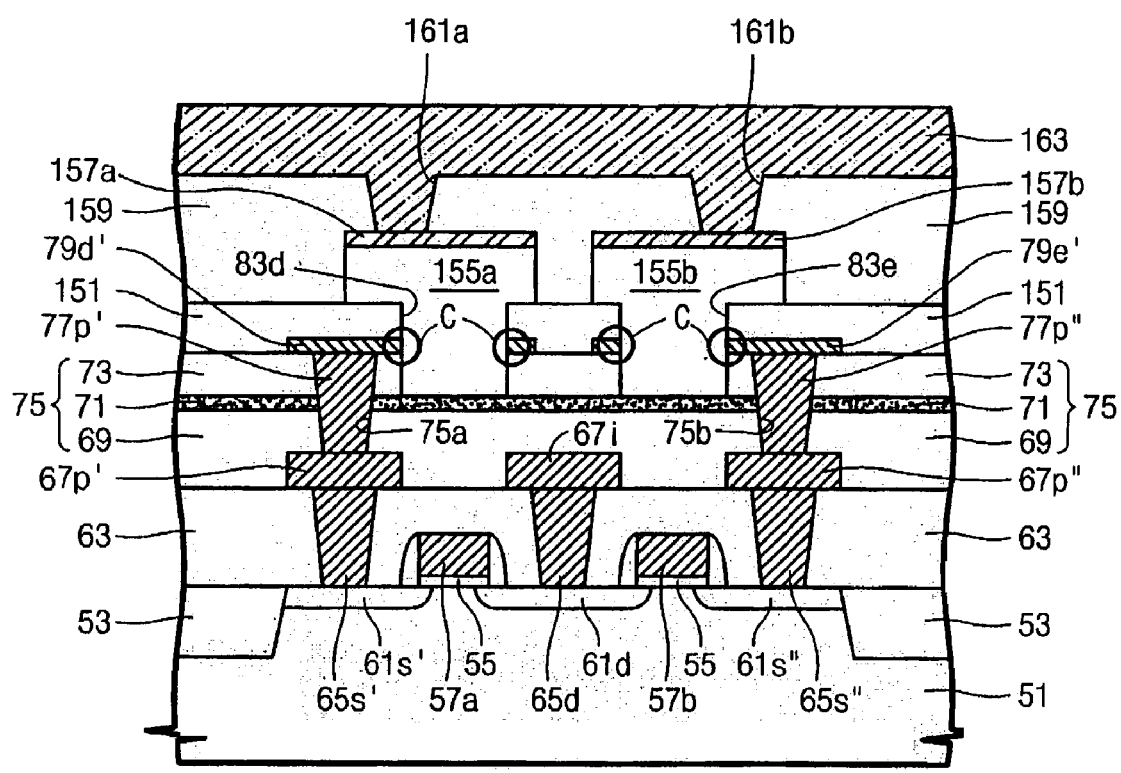

FIGS. 19-21 illustrate fabrication processes used in making the memory cells shown in FIGS. 17 and 18. For brevity, processes illustrated and described above are not repeated here. FIG. 19 shows a bottom electrode layer 79d and 79e as formed on the insulating layer 75. The bottom electrode layers 79d and 79e are much larger than the bottom electrodes 79a and 79b illustrated in FIGS. 4-7. An insulating layer 151 is formed on the bottom electrode layers 79a and 79b and a photoresist layer 153 is formed on the insulating layer 151. The photoresist layer is patterned as illustrated in FIG. 19.

After patterning the photoresist layer 153, an etching process creates the trenches 83d and 83e by etching through portions of the insulating layer 151, completely through the bottom electrode layers 79a and 79b (such that a hole in the bottom electrode layers remains), and through some of the insulating layer 75. If the insulating layer 75 includes an etch stop layer (as illustrated in FIGS. 19 and 20), the etching process ends at the etch stop layer. Once etched, a phase changeable material layer 155 is deposited within the trenches 83d and 83e, and on the insulating layer 151. A top electrode layer 157 is formed on the phase changeable layer 155.

As illustrated in FIG. 21, the top electrode layer 157 is patterned to form a pair of top electrodes, 157a and 157b. Next, a second insulating layer 159 is formed over the top electrodes 157a and 157b, and in other areas over the insulating layer 151. The second insulating layer 159 is patterned with contact holes 161a and 161b, and a contact line is formed on the second insulating layer and within the contact holes. The contact line 163 is electrically connected to the top electrodes 157a and 157b.

In the finished pair of memory cells, the phase changeable material layer 155 is in contact with an edge "C" of the bottom electrodes 77p' and 77p''. Although FIG. 21 shows the contacts "C" as four discrete areas (two for each cell), the section line III (FIG. 17) actually cuts through the center of the bottom electrodes 77p' and 77p''. Therefore, the contacts "C" are really a perimeter edge through the bottom electrodes 77p' and 77p'', one perimeter edge per each cell. That is, the contacts C are each a respective sidewall of a hole through the bottom electrodes 77p' and 77p''. Although illustrated in FIG. 17 as having square or rectangular holes, the shape of the holes through the bottom electrodes 77p' and 77p'' within the trenches 83d and 83e may be any shape, including circular or oval, for instance.

Figure 1:
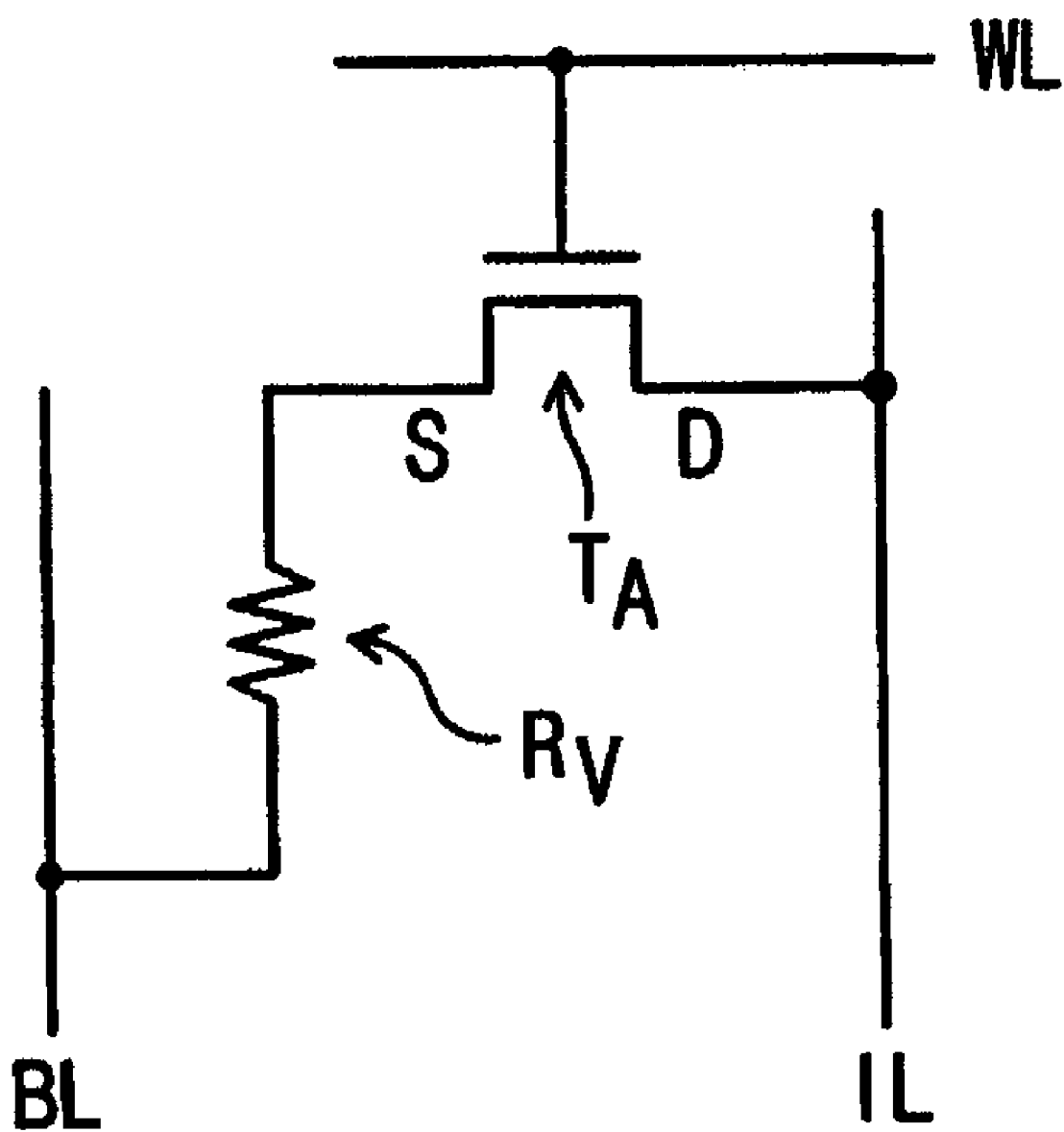
FIG. 1 is a schematic diagram of a phase changeable transistor.
Figure 2:
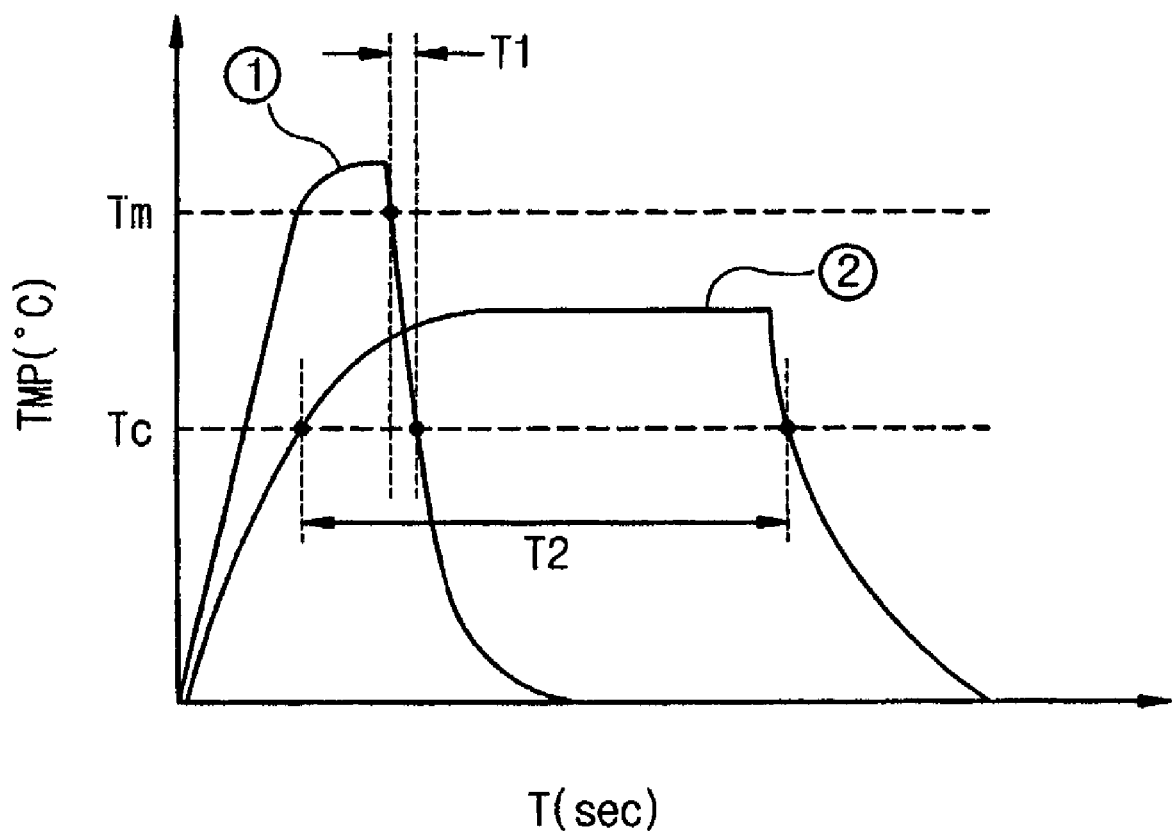
FIG. 2 is a graph illustrating times and temperatures applied to a phase changeable transistor material to cause the material to change into different states.

In operation, when current flows through a cell as illustrated in FIG. 21 for the desired time and temperature (explained above with reference to FIG. 2), a portion of the phase changeable layer 155 changes state and resistivity. Because the contact "C" in this embodiment extends along a perimeter through the bottom electrode 77p' and 77p'', the portion of the phase changeable layer 155 that changes state is an area all along the perimeter of the opening in the bottom electrode. This portion will have the same shape as the hole through the bottom electrode, of course.

According to embodiments of the present invention as described above, a portion of the sidewall of the bottom electrode, or a perimeter edge of a contact opening through the bottom electrode is in direct contact with the phase changeable material pattern. Thus, when the thickness of the bottom electrode is relatively thin, the contact area between the bottom electrode and the phase changeable material pattern is significantly decreased as compared to the memory cells of the prior art. As a result, it is possible to reduce power consumption of the phase changeable memory device and to form reliable and compact phase changeable memory cells.

What is claimed is:

1. A phase changeable memory device comprising:
   a phase changeable material;
   a first electrode directly contacting a top surface of the phase changeable material; and
   a second electrode having a sidewall, the sidewall of the second electrode directly contacting the phase changeable material.

2. The phase changeable memory device of claim 1, wherein the second electrode directly contacts a side surface of the phase changeable material.

3. The phase changeable memory device of claim 2, wherein a width of the sidewall of the second electrode is smaller than a width of the side surface of the phase changeable material.

4. The phase changeable memory device of claim 2, wherein a bottom surface of the phase changeable material is lower in height than a bottom surface of the second electrode.

5. The phase changeable memory device of claim 1, further comprising a neighboring first electrode and a neighboring second electrode, wherein a sidewall of a neighboring second electrode directly contacts the phase changeable material, and wherein the neighboring first electrode directly contacts the top surface of the phase changeable material and is connected to the first electrode.

6. The phase changeable memory device of claim 5, wherein a width of the sidewall of the second electrode and a width of the sidewall of the neighboring second electrode are smaller than a width of the side surface of the phase changeable material.

7. The phase changeable memory device of claim 5, wherein a bottom surface of the phase changeable material is lower in height than a bottom surface of the second electrode and a bottom surface of the neighboring second electrode.

8. The phase changeable memory device of claim 1, wherein a bottom surface of the phase changeable material is lower in height than a bottom surface of the second electrode.

9. The phase changeable memory device of claim 1, wherein the second electrode has a hole, a sidewall of the hole being the sidewall of the second electrode, and the phase changeable material is inserted in the hole of the second electrode such that a sidewall of the phase changeable material directly contacts the sidewall of the second electrode.

10. The phase changeable memory device of claim 2, further comprising a transistor including a source region coupled to a source contact, a drain region coupled to a drain contact, and a gate electrode, and wherein the second electrode is coupled to one of the source and drain contacts.

11. The phase changeable memory device of claim 2, wherein the phase changeable material comprises a chalcogenide material.

12. The phase changeable memory device of claim 2, wherein the phase changeable material comprises a compound that includes germanium, antimony, and tellurium.

13. The phase changeable memory device of claim 2, wherein a size of the top surface of the phase changeable material is larger than a size of a bottom surface of the second electrode.

14. A phase changeable memory device comprising:
   a phase changeable material having a top surface, a bottom surface, and a side surface;
   a first electrode directly contacting the top surface of the phase changeable material; and
   a second electrode having a sidewall, the sidewall of the second electrode directly contacting the side surface of the phase changeable material.

15. The phase changeable memory device of claim 14, wherein a size of the top surface of the phase changeable material is larger than a size of the bottom surface of the second electrode contacts the side surface of the changeable material.

16. The phase changeable memory device of claim 15, wherein the bottom surface of the phase changeable material is lower in height than a bottom surface of the second electrode.

17. The phase changeable memory device of claim 14, wherein the second electrode has a hole, a sidewall of the hole being the sidewall of the second electrode, and the phase changeable material is inserted in the hole of the second electrode such that a sidewall of the phase changeable material directly contacts the sidewall of the second electrode.

18. The phase changeable memory device of claim 14, further comprising a neighboring first electrode and a neighboring second electrode, wherein a sidewall of a neighboring second electrode directly contacts the phase changeable material, and wherein the neighboring first electrode directly contacts the top surface of the phase changeable material and is connected to the first electrode.

19. The phase changeable memory device claim 18, wherein the second electrode and the neighboring second electrode are electrically connected to a respective cell transistor.

20. The phase changeable memory device of claim 14, wherein the phase changeable material is formed within an isolation trench of an insulating material, the isolation trench having at least one side that is longer than at least one of the sidewall of the second electrode.

21. The phase changeable memory device of claim 14, wherein a side surface of the second electrode adjacent to the phase changeable material has a height between about 3 to 7 nanometers and a width between about 20 to 150 nanometers.

22. The phase changeable memory device of claim 14, wherein the side surface of the second electrode contacting the phase changeable material has a height less than 50 nanometers.

23. A phase changeable memory device comprising:
   a first variable resistor; and
   a second variable resistor,
   wherein each variable resistor includes:
      a phase changeable material;
      a first electrode directly contacting a top surface of the phase changeable material; and
      a second electrode having a side wall, the sidewall of the second electrode directly contacting the phase changeable material,
   wherein the phase changeable material of the first variable resistor is connected to the phase changeable material of the second variable resistor.

24. The phase changeable memory device of claim 23, wherein respective sidewalls of the second electrode directly contact respective side surfaces of the first and second phase changeable material.

25. The phase changeable memory device of claim 24, wherein the phase changeable material of the first variable resistor is spaced apart from the phase changeable material of the second variable resistor.

26. The phase changeable memory device of claim 23, wherein the second electrode has a hole, a sidewall of the hole being the sidewall of the second electrode, and the phase changeable materials is inserted in the hole of the second electrode such that the side surface of the phase changeable materials directly contacts the sidewall of the second electrode.

27. The phase changeable memory device of claim 23, wherein the phase changeable material for each of the variable resistors is formed in a separate trench in an insulating layer.

28. A phase changeable memory device comprising:
   a first variable resistor; and
   a second variable resistor,
   wherein each variable resistor includes:
      a phase changeable material;
      a first electrode directly contacting a top surface of the phase changeable material; and
      a second electrode having a sidewall, the sidewall of the second electrode directly contacting the phase changeable material,
   wherein the phase changeable material of the first and second variable resistors is formed in a single trench in an insulating layer.

29. The phase changeable memory device of claim 23, wherein the first electrode for each of the variable resistors is electrically couple to each other, and further comprising a bit line coupled to the first electrode.

* * * * *